United States Patent
Hwang et al.

(10) Patent No.: US 7,989,939 B2
(45) Date of Patent: Aug. 2, 2011

(54) SEMICONDUCTOR PACKAGE WHICH INCLUDES AN INSULATING LAYER LOCATED BETWEEN PACKAGE SUBSTRATES WHICH MAY PREVENT AN ELECTRICAL SHORT CAUSED BY A BONDING WIRE

(75) Inventors: Hyun-Ik Hwang, Asan-si (KR); YongJin Jung, Cheonan-si (KR); Kunho Song, Cheonan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/549,033

(22) Filed: Aug. 27, 2009

(65) Prior Publication Data
US 2010/0052130 A1 Mar. 4, 2010

(30) Foreign Application Priority Data
Sep. 4, 2008 (KR) .................. 10-2008-0087451

(51) Int. Cl.
*H01L 23/52* (2006.01)
*H01L 23/49* (2006.01)

(52) U.S. Cl. ......... 257/685; 257/E23.141; 257/E23.024; 257/784; 257/680; 257/773; 257/774; 257/775; 257/776; 257/786

(58) Field of Classification Search .............. 257/685, 257/784, 680, 773, 774, 775, 776, 786, E23.141, 257/E23.024
See application file for complete search history.

(56) References Cited

U.S. PATENT DOCUMENTS

| | | | | |
|---|---|---|---|---|
| 4,208,005 A * | 6/1980 | Nate et al. | ...... | 228/175 |
| 6,555,919 B1 * | 4/2003 | Tsai et al. | ...... | 257/777 |
| 6,740,983 B2 * | 5/2004 | Tay et al. | ...... | 257/780 |
| 6,822,337 B2 * | 11/2004 | Bai | ...... | 257/783 |
| 7,190,061 B2 * | 3/2007 | Lee | ...... | 257/686 |
| 7,622,798 B2 * | 11/2009 | Chye et al. | ...... | 257/686 |
| 7,777,237 B2 * | 8/2010 | Chen | ...... | 257/81 |
| 2002/0053736 A1 * | 5/2002 | Corisis | ...... | 257/730 |
| 2005/0263906 A1 * | 12/2005 | Hall | ...... | 257/777 |
| 2007/0023886 A1 * | 2/2007 | Hedler et al. | ...... | 257/686 |
| 2008/0090332 A1 * | 4/2008 | Cheng et al. | ...... | 438/118 |
| 2009/0050266 A1 * | 2/2009 | Yang | ...... | 156/307.3 |
| 2009/0263936 A1 * | 10/2009 | Fujisawa et al. | ...... | 438/118 |
| 2010/0096662 A1 * | 4/2010 | Lin et al. | ...... | 257/99 |
| 2010/0109139 A1 * | 5/2010 | Lee | ...... | 257/686 |
| 2010/0155768 A1 * | 6/2010 | Lin et al. | ...... | 257/99 |

FOREIGN PATENT DOCUMENTS

| | | |
|---|---|---|
| JP | 05-152365 | 6/1993 |
| JP | 08-288426 | 11/1996 |
| JP | 11-323297 | * 11/1999 |
| JP | 2002-100840 | 4/2002 |
| KR | 1020070030519 | 3/2007 |

* cited by examiner

*Primary Examiner* — Alexander O Williams
(74) *Attorney, Agent, or Firm* — F. Chau & Associates, LLC

(57) ABSTRACT

Provided is a semiconductor package. The semiconductor package includes a bonding wire electrically connecting a first package substrate and a second package substrate to each other and an insulating layer adhering the first package substrate and the second package substrate to each other and covering a portion of the bonding wire.

14 Claims, 15 Drawing Sheets

SEMICONDUCTOR PACKAGE WHICH INCLUDES AN INSULATING LAYER LOCATED BETWEEN PACKAGE SUBSTRATES WHICH MAY PREVENT AN ELECTRICAL SHORT CAUSED BY A BONDING WIRE

CROSS-REFERENCE TO RELATED APPLICATIONS

This patent application claims priority under 35 U.S.C.§119 of Korean Patent Application No. 10-2008-0087451, filed on Sep. 4, 2008, the entire disclosure of which is hereby incorporated by reference herein in it's entirety.

BACKGROUND (i) Technical Field

The present disclosure relates to semiconductor package and to methods for manufacturing the same, and more particularly, to a semiconductor package having improved electrical characteristics and to a method of manufacturing the same.

(ii) Description of the Related Art

One of the techniques used in the manufacturing of a semiconductor package is a wire bonding technique. The wire bonding technique is a technique wherein a semiconductor chip may be electrically connected to a circuit board using a bonding wire. However, when using the bonding wire, the bonding wire may be bent during the formation of a molding layer which is a subsequent process. For example, when forming the molding layer, the bonding wire may hang down or may be bent sideward due to an injection pressure of a molding material. When the bonding wire is bent, the electrical characteristics of the semiconductor package may be deteriorated because adjacent bonding wires are in contact with each other or the bonding wire is in contact with a bonding pad and an interconnection pattern formed on the board.

Thus, there is a need in the art for a semiconductor package having improved electrical characteristics and to a method for manufacturing the same.

SUMMARY

In accordance with an exemplary embodiment of the present invention a semiconductor package is provided. The semiconductor package includes a first package substrate and a second package substrate, a bonding wire electrically connecting the first package substrate and the second package substrate to each other and an insulating layer which adheres the first package substrate and the second package substrate to each other and covers a portion of the bonding wire.

In accordance with another exemplary embodiment of the present invention, a method for manufacturing a semiconductor package is provided. The method includes interposing an insulating layer to combine a first package substrate and a second package substrate with each other, forming a bonding wire electrically connecting the first package substrate and the second package substrate to each other and extending the insulating layer to form a wire fixing layer covering a portion of the bonding wire.

BRIEF DESCRIPTION OF THE DRAWINGS

Exemplary embodiments of the present invention can be understood in more detail from the following description taken in conjunction with the drawings in which.

DETAILED DESCRIPTION OF THE EXEMPLARY EMBODIMENTS

Figure 1:
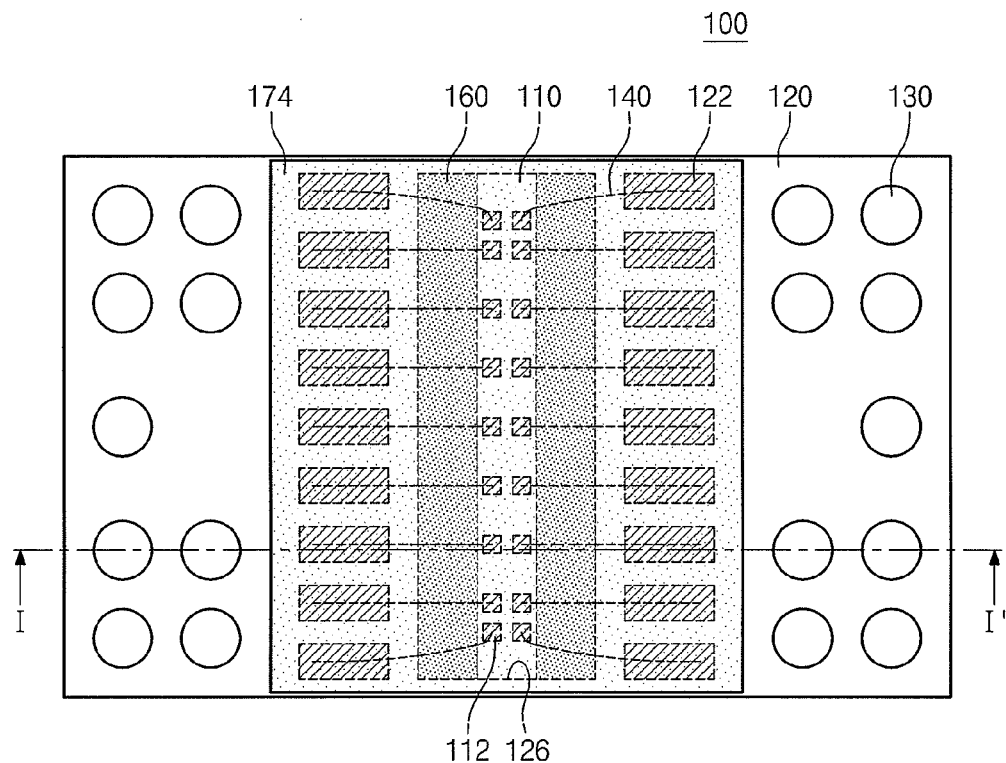
FIG. 1 is a top plan view of a semiconductor package according to an exemplary embodiment of the present invention.

The present invention now will be described more fully hereinafter with reference to the accompanying drawings, in which exemplary embodiments of the invention are shown. This invention may, however, be embodied in many different forms and should not be construed as limited to the exemplary embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Exemplary embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, exemplary embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Figure 2:
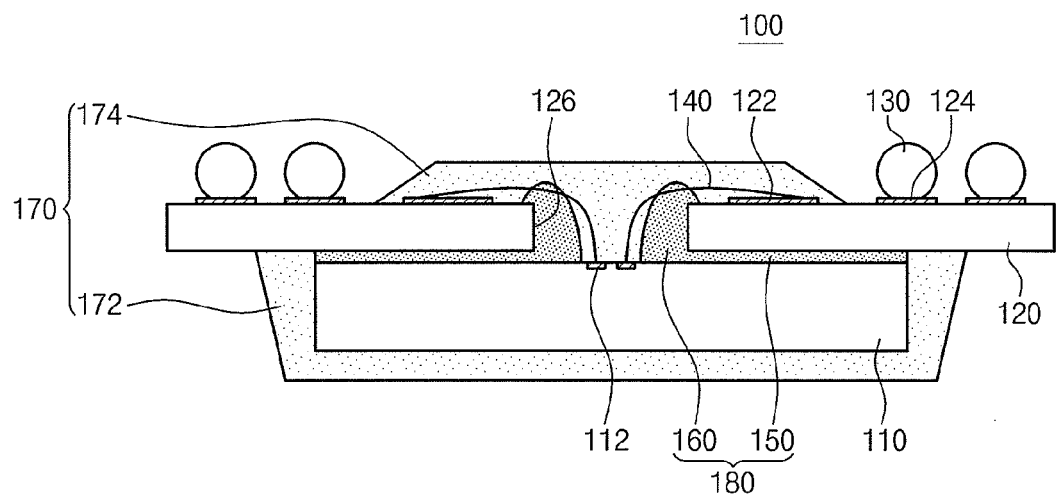
FIG. 2 is a cross sectional view taken along the line I-I' depicted in FIG. 1.

FIG. 1 is a top plan view of a semiconductor package according to an exemplary embodiment of the present invention. FIG. 2 is a cross sectional view taken along the line I-I' depicted in FIG. 1.

Referring to FIGS. 1 and 2, a semiconductor package 100 according to an exemplary embodiment of the present invention may include a first package substrate 110 and a second package substrate 120 which are combined with each other, a bonding wire 140 electrically connecting the first package substrate 110 to the second package substrate 120 and an insulating layer 180 including an adhesion layer 150 adhering the first and second package substrates 110 and 120 to each other and a wire fixing layer 160 fixing the bonding wire 140.

The first package substrate 110 may be a substrate including, for example, an electrical device. For example, the first package substrate 110 may include at least one semiconductor integrated chip (IC). At least one first bonding pad 112 may be formed on the front side of the first package substrate 110. For example, a plurality of the first bonding pads 112 may be arranged to be parallel along a specific direction at a center of the first package substrate 110. The first bonding pad 112 may be arranged along a direction crossing a length direction of the bonding wire 140.

The second package substrate 120 may include a single layer substrate where circuit interconnections are formed or a multi-layer substrate where circuit interconnections are formed. The second package substrate 120 may be, for example, a substrate for electrically operating the first package substrate 110. For example, the second package substrate 120 may include a printed circuit board (PCB). The second package substrate 120 may include the front side facing the first package substrate 110 and the back side on the opposite side of the front side. A second bonding pad 122 and a third bonding pad 124 may be formed on the back side. The third bonding pad 124 may be disposed on both edges of the back side. The second bonding pad 122 may be disposed on a center of the second package substrate 120 compared with the third bonding pad 124. A bonding terminal 130 may be adhered to the third bonding pad 124. The bonding terminal 130 may be a connection terminal electrically connecting the second package substrate 120 to an external device. The bonding terminal 130 may include, for example, a solder ball. The bonding terminal 130 may transmit an electrical signal between the first package substrate 110 and the external device.

At least one through hole 126 may be formed in the second package substrate 120. For example, the through hole 126 formed to be long in a specific direction at a center of the second package substrate 120. The through hole 126 may be used as a space for setting up the bonding wire 140.

One end of the bonding wire 140 is connected to the first bonding pad 112 and the other end of the bonding wire 140 is connected to the second bonding pad 122. The bonding wire 140 can electrically connect the first package substrate 110 to the second package substrate 120. The adhesion layer 150 may be interposed between the first and second package substrates 110 and 120 to combine the first package substrate 110 with the second package substrate 120. The adhesion layer 150 may be formed of a material including, for example, a resin. For example, the adhesion layer 150 may be formed of a material including epoxy resin.

The wire fixing layer 160 may fix the bonding wire 140. For example, the wire fixing layer 160 may be formed so as to occupy a portion of the through hole 126 and cover a portion of the bonding wire 140. The bonding wire 140 is fixed by the wire fixing layer 160 to prevent bending of the bonding wire 140 due to a chemical/physical impact. Accordingly, the semiconductor package 100 may prevent an electrical short generated when the bonding wire 140 is in contact with an adjacent bonding wire or the bonding wire 140 is in contact with a bonding pad (e.g., the first bonding pad 112 and the second bonding pad 122).

The wire fixing layer 160 may be formed to extend from the adhesion layer 150. For example, the wire fixing layer 160 may be a portion of the adhesion layer 150 which extends from the adhesion layer 150 interposed between the first and second package substrates 10 and 120 to cover the bonding wire 140. As the wire fixing layer 160 is formed to extend from the adhesion layer 150, the adhesion layer 150 and the wire fixing layer 160 may have the same material and an interface between the adhesion layer 150 and the wire fixing layer 160 may not exist.

The semiconductor package 100 may further include a molding layer 170. The molding layer 170 may include a first molding layer 172 and a second molding layer 174. The first molding layer 172 may be formed to cover the first package substrate 110 and the second molding layer 174 may be formed to cover the second package substrate 120. The second molding layer 174 may be formed to cover the second bonding pad 122, the through hole 126 and the bonding wire 140 on the second package substrate 120. In addition, the second molding layer 174 may be formed to cover around a lower portion of the bonding terminal 130. The molding layer 170 may protect the first and second package substrates 110 and 120 from a chemical/physical external environment.

A process for manufacturing the semiconductor package 100 described above will be explained in detail below. The description of common features already discussed in the semiconductor package 100 will be omitted for brevity.

Figure 3A:
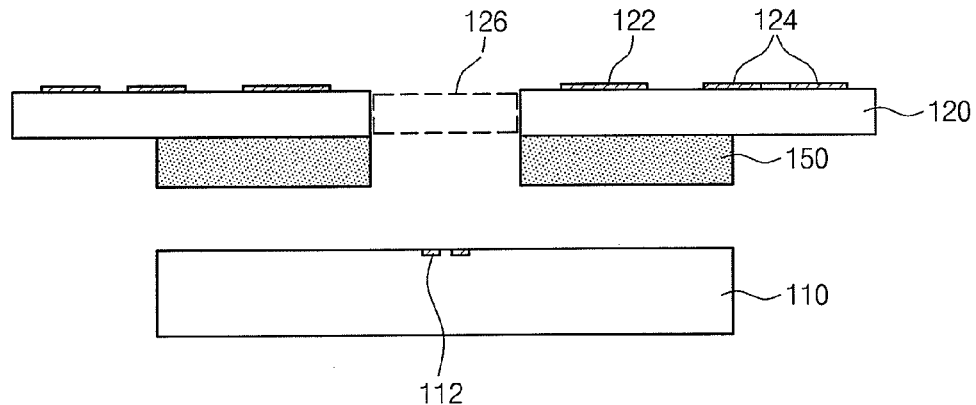
FIGS. 3A through 3E are views illustrating processes for manufacturing the semiconductor package depicted in FIGS. 1 and 2.

FIGS. 3A through 3E are views illustrating processes for manufacturing the semiconductor package depicted in FIGS. 1 and 2. Referring to FIG. 3A, a first package substrate 110 and a second package substrate 120 are provided. The first package substrate 110 may include, for example, a semiconductor integrated circuit chip and the second package substrate 120 may include, for example, a printed circuit board (PCB). A first bonding pad 112 may be formed on the first package substrate 110. A through hole 126 may be formed in the second package substrate 120. The through hole 126 may be formed at a center of the second package substrate 120. An adhesion layer 150 may be formed on a front side of the second package substrate 120 facing the first package substrate 110. The adhesion layer 150 may also be formed on a front side of the first package substrate 110. A second bonding pad 122 and a third bonding pad 124 may be formed on a back side of the second package substrate 120. The second bonding pad 122 may be disposed to be adjacent to the through hole 126 compared with the third bonding pad 124.

Figure 3B:
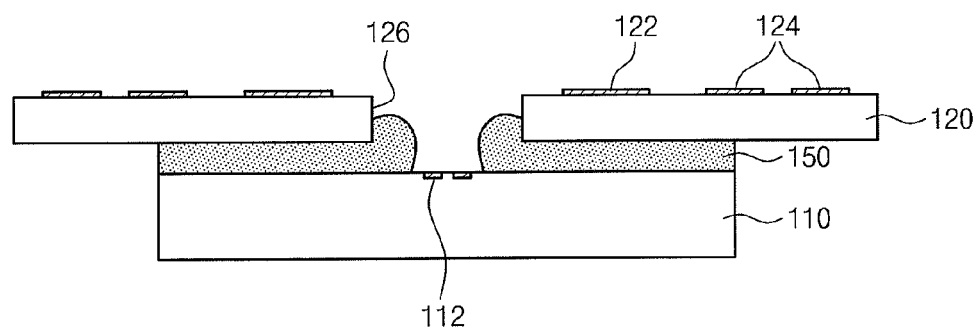
Figure 3C:
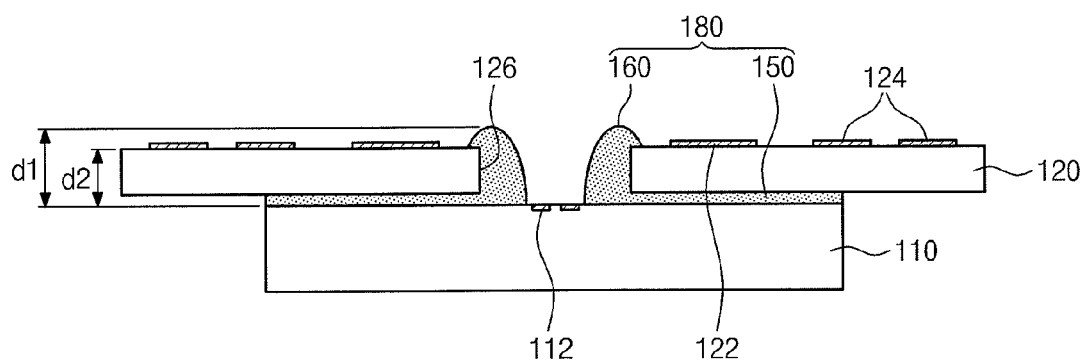

Referring to FIGS. 3B and 3C, the first and second package substrates 110 and 120 are combined with each other. As the first and second package substrates 110 and 120 are adhered closely to each other, a portion of the adhesion layer 150 may be pushed out from a region between the first and second package substrates 110 and 120. A portion of the adhesion layer 150 may extend in the inside of the through hole 126 from a front side of the first package substrate 110. As a result, a portion of the adhesion layer 150 pushed out from a region between the first and second package substrates 110 and 120 may constitute a wire fixing layer 160. At this time, a distance (d1) between a front side of the first package substrate 110 and a top surface of the wire fixing layer 160 may be greater than a distance (d2) between a front side of the first package substrate 110 and a front side of the second package substrate 120. The wire fixing layer 160 may sufficiently cover a bonding wire (140 of FIG. 3D) which will be formed in a subsequent process.

The quality of material and the thixotropic index for the adhesion layer 150 described above can be controlled based upon, for example, an adhesion function of the first and second package substrates 110 and 120 and an effective creation of the wire fixing layer 160. For example, the adhesion layer 150 may be formed of material including a resin. For example, the adhesion layer 150 may be formed of resin having a thixotropic index of about 1.75 to about 2.75. In this case, the adhesion layer 150 pushed out from a region between the first and second package substrates 110 and 120 may be pushed up from a surface of the first package substrate 110.

| | Thixotropic index | | |
|---|---|---|---|
| | about 1.79 | about 1.85 | about 2.47 |
| Silicon polymer | about 66/w/t % | about 60 w/t % | about 54 w/t % |
| Filler | about 18 w/t % | about 24 w/t % | about 30 w/t % |
| The other materials | about 16 w/t % | about 16 w/t % | about 16 w/t % |

The above table represents a change of the thixotropic index of a silicon adhesive according to a change of a weight percentage of a silicon polymer and filler. Referring to the above table, a silicon adhesive used for an adhesion of substrates during a semiconductor package process may include, for example, a polymer, a filler and the other materials. The other materials may include, for example, a cross linker, an adhesion promoter, a catalyst, additives and a pigment.

As shown in the above table, when a weight percentage of the other materials is fixed, the thixotropic index of the silicon adhesive may increase as the weight percentage of the silicon polymer decreases (or the weight percentage of the filler increases). Thus, the silicon adhesive (e.g., an insulating layer 180) may have a thixotropic index of about 1.75 to about 2.75 by controlling, for example the weight percentage of the silicon polymer and the filler.

Figure 3D:
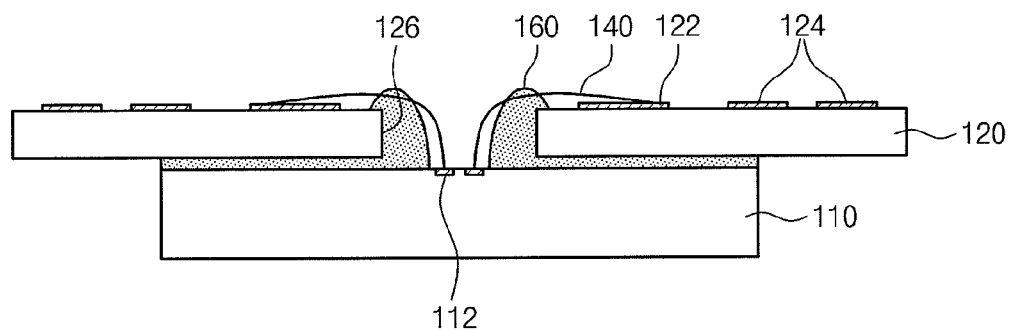

Referring to FIG. 3D, a wire bonding process is performed. For example, a bonding wire 140 connecting the first bonding pad 112 on the first package substrate 110 and the second bonding pad 122 on the second package substrate 120 to each other may be formed. At this time, the bonding wire 140 may be covered with the wire fixing layer 160. Accordingly, the bonding wire 140 may be insulated by the wire fixing layer 160. As a portion of the bonding wire 140 adjacent to the second bonding pad 122 is fixed by the wire fixing layer 160, the possibility that the bonding wire 140 is in contact with the second bonding pad 122 due to a bend of the bonding wire 140 may be reduced. Thus, a portion of bonding wire 140 covered with the wire fixing layer 160 may be a portion adjacent to the second bonding pad 122.

Figure 3E:
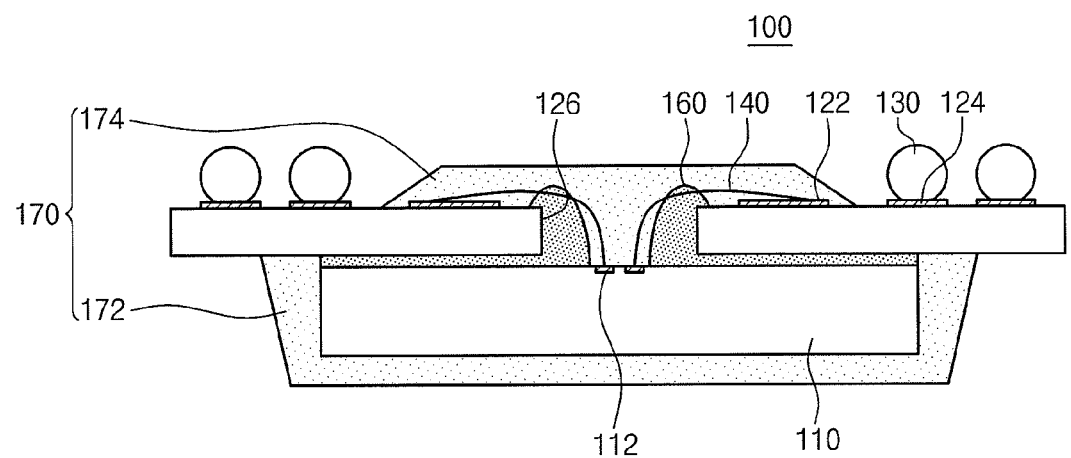

Referring to FIG. 3E, a molding layer 170 covering the first and second package substrates 110 and 120 is provided. The molding layer 170 may include a first molding layer 172 covering the first package substrate 110 and a second molding layer 174 covering the second package substrate 120. The first and second molding layers 172 and 174 may be formed by, for example, performing an injection molding process that a molding material is injected into an inside of a mold after wrapping the semiconductor package 100 in the mold. The first molding layer 172 is formed to cover a back side and the side of the first package substrate 110 and the second molding layer 174 may be formed to cover the first through hole 126 and the second bonding pad 122 of the second package substrate 120. A bonding terminal 130 may be formed on second package substrate 120. The bonding terminal 130 may be welded to the third bonding pad 124. The bonding terminal 130 may include, for example, a solder ball.

The semiconductor package 100 according to an exemplary embodiment of the present invention described above includes the wire fixing layer 160 fixing the bonding wire 140 to prevent a bending of the bonding wire 140. Accordingly, the semiconductor package 100 can prevent an electrical short generated when the bonding wire 140 is in contact with an adjacent bonding wire or the bonding wire 140 is in contact with a bonding pad.

Also, according to an exemplary embodiment of the present invention, as the wire fixing layer 160 is formed by extending the adhesion layer 150, a separate material for forming the wire fixing layer 160 may not be used. In addition, as a formation of the wire fixing layer 160 is completed while the first and second package substrates 110 and 120 are combined with each other by the adhesion layer 150, an additional process for the formation of the wire fixing layer 160 is not added.

Also, according to an exemplary embodiment of the present invention, the bonding wire 140 is covered with the wire fixing layer 160 during a wire bonding process to be connected to the first and second bonding pads 112 and 122. Accordingly, even when a location for setting up the bonding wire 140 misses a predetermined location a little, the bonding wire 140 may still be prevented by the wire fixing layer 160 from being in contact with an adjacent bonding wire and also prevent the bonding wire 140 from being in contact with a bonding pad. For example, when combining the first and second package substrates 110 and 120 with each other, a combination location of the first and second package substrates 110 and 120 may get out of a predetermined location. In this case, a bonding location of the bonding wire 140 may get out of a predetermined location during a wire bonding process. At this time, the wire fixing layer 160 covers the bonding wire 140 to insulate the bonding wire 140 and to maintain a space between adjacent bonding wires. Exemplary embodiments of the present invention may prevent an electrical short according to a bend of the bonding wire 140.

Figure 4:
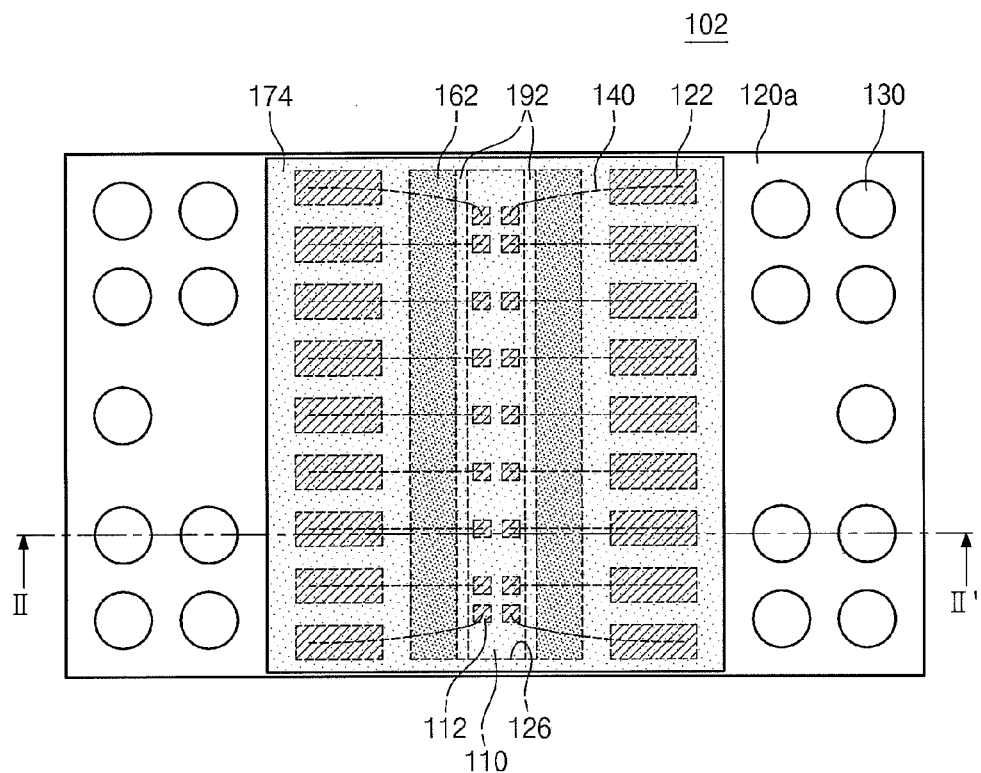
FIG. 4 is a top plan view of a semiconductor package according to a modified exemplary embodiment of the semiconductor package depicted in FIG. 1.
Figure 5:
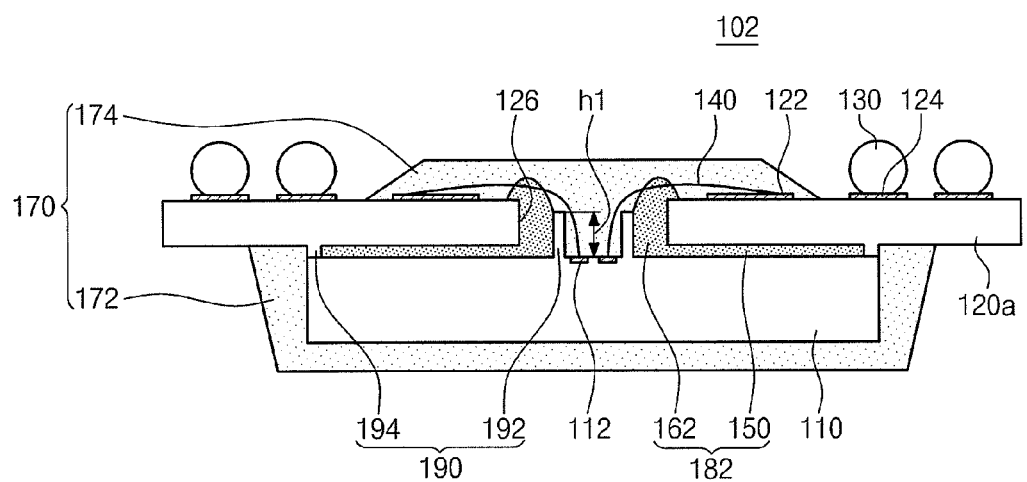
FIG. 5 is a cross sectional view taken along the line II-II' depicted in FIG. 4.

FIG. 4 is a top plan view of a semiconductor package according to a modified exemplary embodiment of the semiconductor package depicted in FIG. 1. FIG. 5 is a cross sectional view taken along the line II-II' depicted in FIG. 4.

Referring to FIGS. 4 and 5, a semiconductor package 102 may further include a guide member 190. The semiconductor package 102 may include first and second package substrates 110 and 120a combined with each other, a bonding wire 140 connected to first and second bonding pads 112 and 122 formed on the first and second package substrates 110 and 120a respectively, a bonding terminal 130 welded to a third bonding pad 124, an insulating layer 182 having an adhesion layer 150 combining the first and second package substrates 110 and 120a and a wire fixing layer 162 fixing the bonding wire 140, first and second molding layers 172 and 174 covering the first and second package substrates 110 and 120a respectively and a guide member 190.

The guide member 190 may be provided to guide the adhesion layer 150 pushed out from a region between the first and second package substrates 110 and 120a when forming the wire fixing layer 162. Accordingly, the wire fixing layer 162 of a predetermined shape can be more efficiently formed by the guide member 190. The guide member 190 may include at least one protrusion. The guide member 190 may include a first protrusion 192 and a second protrusion 194.

The first protrusion 192 may be formed to extend from a front side of the first package substrate 110. At this time, the first protrusion 192 may be disposed between an inside of a through hole 126 formed at a center of the second package substrate 120a and the first bonding pad 112 and may be spaced apart from the inside of the through hole 126. A space between the inside of the through hole 126 and the first protrusion 192 may be used as a path for forming the wire fixing layer 162. Thus, the space between the inside of the through hole 126 and the first protrusion 192 may be controlled to suit a predetermined shape of the wire fixing layer 162. A height (h1) of the first protrusion 192 may be controlled to be lower as compared to a height of the bonding wire 140. Accordingly, when performing a wire bonding process, the bonding wire 140 may be prevented from colliding with the first protrusion 192. The second protrusion 194 may be formed to protrude toward the first package substrate 110 from a front side of the second package substrate 120a facing the first package substrate 110. The second protrusion 194 may be formed on the second package substrate 120a facing an edge of a front side of the first package substrate 110.

A process for manufacturing the semiconductor package 102 described above will be described in detail. The description of common features already discussed in the semiconductor package 102 will be omitted for brevity. FIGS. 6A through 6E are views illustrating processes for manufacturing the semiconductor package depicted in FIGS. 4 and 5.

Figure 6A:
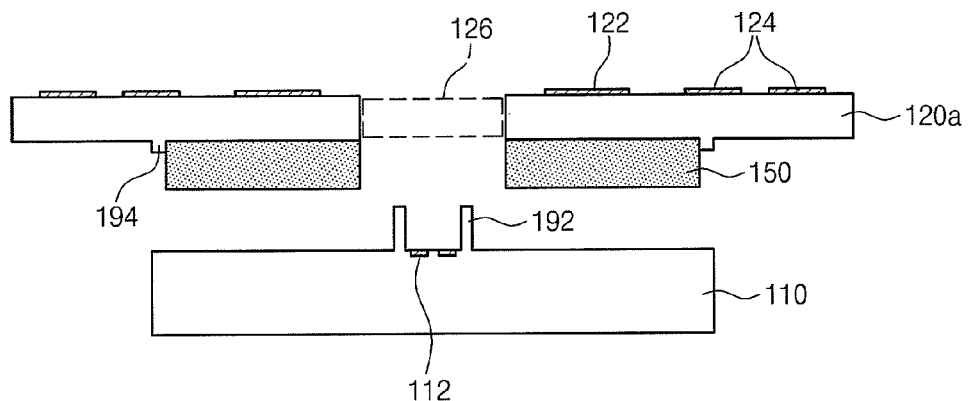
FIGS. 6A through 6E are views illustrating processes for manufacturing the semiconductor package depicted in FIGS. 4 and 5.

Referring to FIG. 6A, a first package substrate 110 including a first bonding pad 112 and a second package substrate 120a including a second bonding pad 122 are prepared. The first package substrate 110 may include, for example, a semiconductor integrated circuit chip and the second package substrate 120a may include, for example, a printed circuit board (PCB). A through hole 126 may be formed at a center of the second package substrate 120a. The first package substrate 110 may include a first protrusion 192 which protrudes toward the through hole 126 from a front side of the first package substrate 110. The second package substrate 120a may include a second protrusion 194 which protrudes toward an edge of the first package substrate 110 from a front side of the second package substrate 120a. An adhesion layer 150 may be formed on a front side of the second package substrate 120a facing the first package substrate 110. The adhesion layer 150 may be formed between the second protrusion 194 and the through hole 126.

Figure 6B:
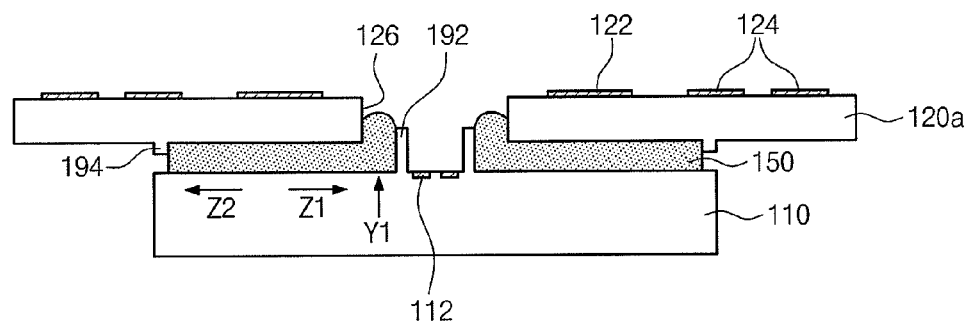
Figure 6C:
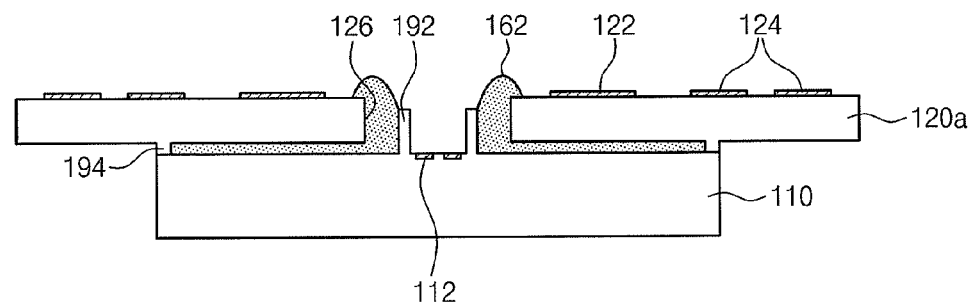

Referring to FIGS. 6B and 6C, the first and second package substrates 110 and 120a are combined with each other. As the first and second package substrates 110 and 120a are adhered closely to each other, a portion of the adhesion layer 150 may be pushed out from a region between the first and second package substrates 110 and 120a. At this time, a portion of adhesion layer 150 extending in a first direction (Z1) may extend in an upward direction (Y1) by the first protrusion 192. That is, the portion of adhesion layer 150 is guided by the inside of the through hole 126 and the first protrusion 192 to extend so as to occupy a portion of the through hole 126. Accordingly, the portion of adhesion layer 150 penetrates the through hole 126 and extends to a back side of the second package substrate 120a to form a wire fixing layer 162.

When the first and second package substrates 110 and 120a are combined with each other, the second protrusion 194 may prevent the adhesion layer 150 from being pushed out toward a second direction (Z2) from a region between the first and second package substrates 110 and 120a. The second direction (Z2) may be opposite to the first direction (Z1). Thus, the second protrusion 194 may prevent the adhesion layer 150 from extending in a space in which a first molding layer (172 of FIG. 6E) is formed. Also, the adhesion layer 150 between the first and second package substrates 110 and 120a can be effectively extended in the upward direction (Y1) by the second protrusion 194 when the first and second package substrates 110 and 120a are combined with each other. In addition, the second protrusion 194 may be used as a means for controlling the degree of close adhesion of the first and second package substrates 110 and 120a when the first and second package substrates 110 and 120a are combined with each other. That is, when the first and second package substrates 110 and 120a are combined with each other, close adhesion of the first and second package substrates 110 and 120a may be stopped by the second protrusion 194. Accordingly, the second protrusion 194 may be used as a stopper stopping close adhesion of the first and second package substrates 110 and 120a.

Figure 6D:
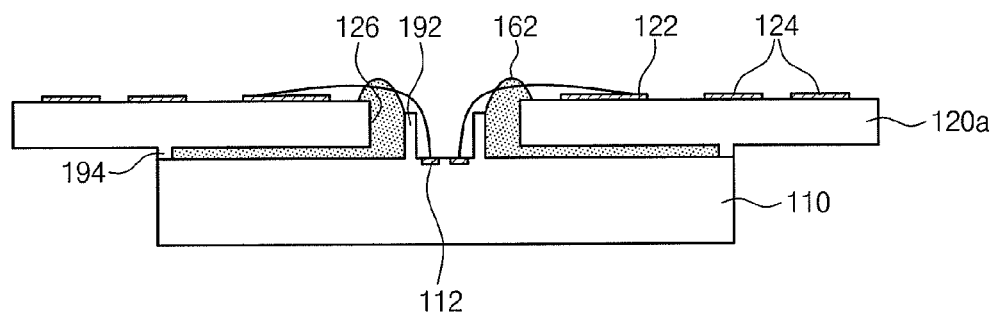

Referring to FIG. 6D, a wire bonding process is performed. The wire bonding process may be substantially equal to or similar to the process of forming the bonding wire 140 described referring to FIG. 3D. For example, a bonding wire connecting a first bonding pad 112 of the first package substrate 110 to a second bonding pad 122 of the second package substrate 120a may be formed. At this time, a portion of bonding wire 140 may be covered with the wire fixing layer 162 formed to extend from the adhesion layer 150.

Figure 6E:
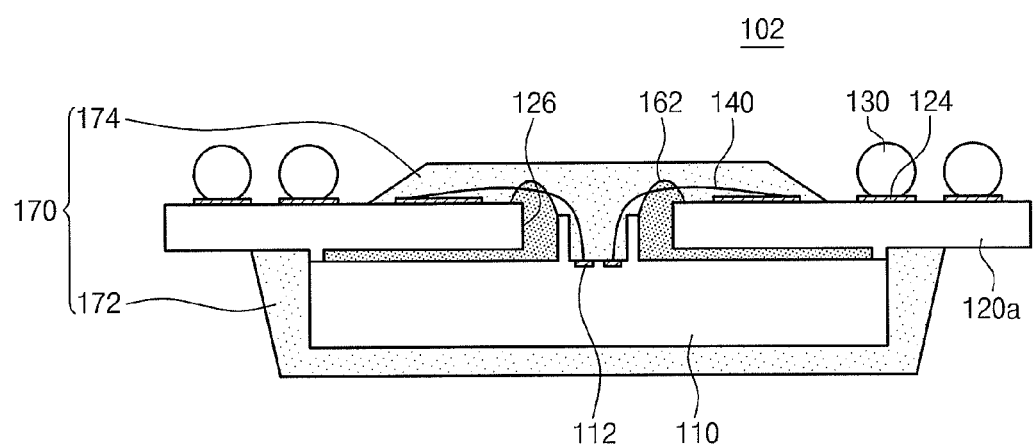

Referring to FIG. 6E, a molding layer 170 covering the first and second package substrates 110 and 120a may be formed. A process for forming the molding layer 170 may be substantially equal to or similar to the process of forming the molding layer 170 described referring to FIG. 3E. A bonding terminal 130 may be formed on the third bonding pad 124 of the second package substrate 120a.

The semiconductor package 102 according to a modified exemplary embodiment of the present invention may further include a guide member 190 compared with the semiconductor package 100 according to an exemplary embodiment of the present invention. The guide member 190 may guide a portion of adhesion layer 150 pushed out from a region between the first and second package substrates 110 and 120a when the first and second package substrates 110 and 120a are combined with each other. Accordingly, the wire fixing layer 162 satisfying a predetermined shape can be more efficiently formed by the guide member 190.

Hereinafter, a semiconductor package according to another exemplary embodiment will be described. Here, the description of common features already discussed in the semiconductor packages 100 and 102 will be omitted for brevity.

Figure 7:
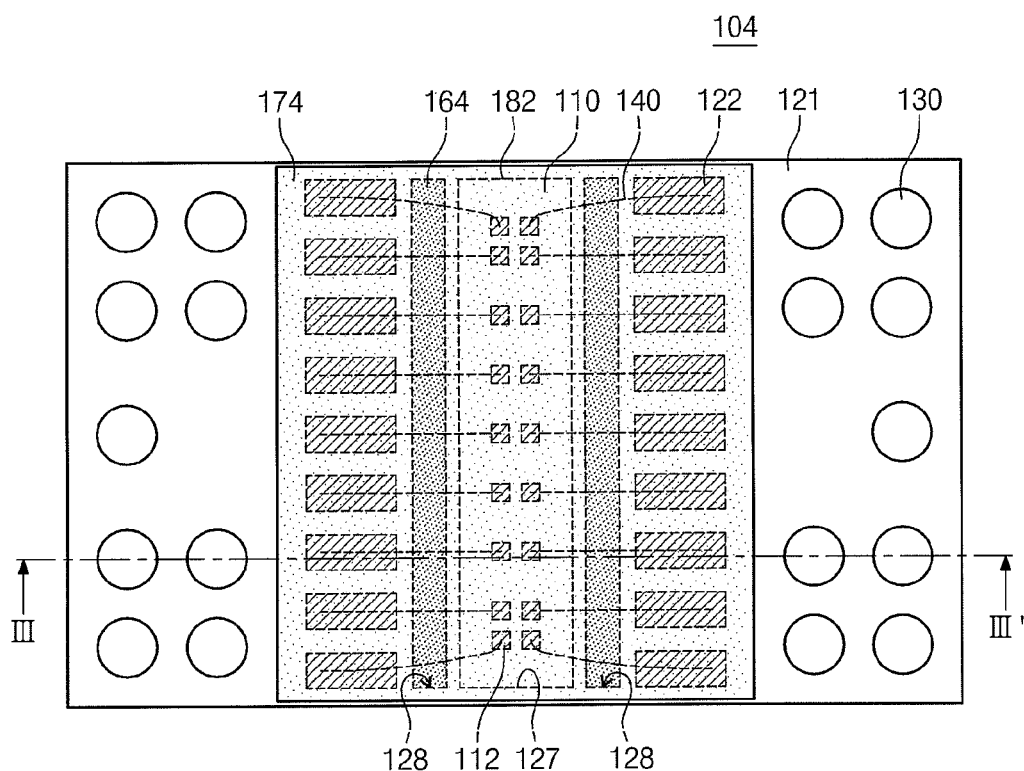
FIG. 7 is a top plan view of a semiconductor package according to an exemplary embodiment of the present invention.
Figure 8:
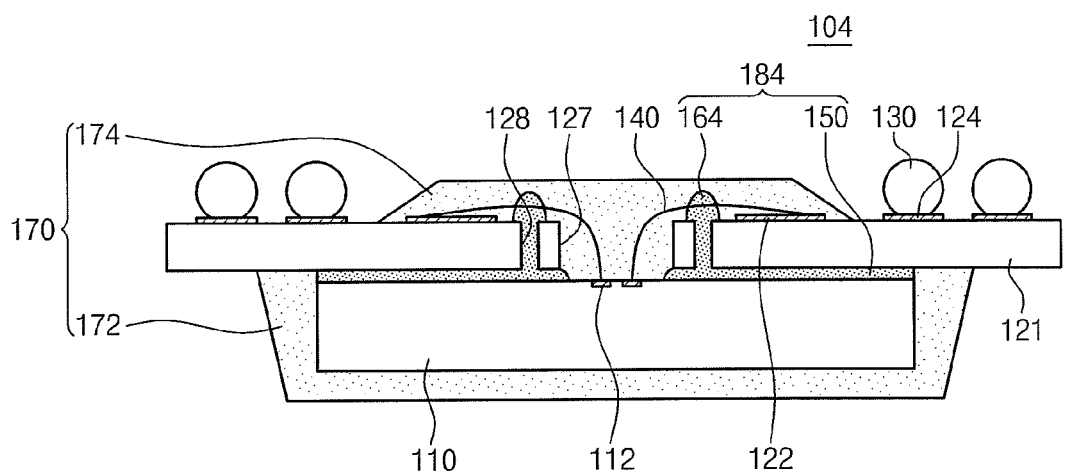
FIG. 8 is a cross sectional view taken along the line III-III' depicted in FIG. 7.

FIG. 7 is a top plan view of a semiconductor package according to another exemplary embodiment of the present invention. FIG. 8 is a cross sectional view taken along the line III-III' depicted in FIG. 7.

Referring to FIGS. 7 and 8, a semiconductor package 104 according to another exemplary embodiment of the present invention may include first and second package substrates 110 and 121 combined with each other, a bonding wire 140 electrically connecting the first and second package substrates 110 and 121 and an insulating layer 184 having an adhesion layer 150 adhering the first and second package substrates 110 and 121 to each other and a wire fixing layer 164 fixing the bonding wire 140.

The first package substrate 110 may be a substrate including, for example, an electrical device. At least one first bonding pad 112 may be formed on a front side of the first package substrate 110. The second package substrate 121 may include, for example, a substrate electrically operating the first package substrate 121. The second package substrate 121 may include a front side facing the first package substrate 110 and a back side which is opposite the front side. A second bonding pad 122 and a third bonding pad 124 may be formed on back side. The second bonding pad 122 may be formed to be adjacent to a center of the second package substrate 121 compared with the third bonding pad 124. A bonding terminal 130 may be welded to the third bonding pad 124.

A first through hole 127 and a second through hole 128 may be formed at the second package substrate 121. The first through hole 127 may have a shape and disposal similar to the through hole 126 described referring to FIGS. 1 and 2. The first through hole 127 may be used as a space in which the bonding wire 140 is set up. The second through hole 128 may be formed a region of the second package substrate 121 between the second bonding pad 122 and the first through hole 127. The second through hole 128 may be used as a space for forming the wire fixing layer 164. The wire fixing layer 164 may be formed to occupy a portion of the second through hole 128 of the second package substrate 121 and to cover a portion of bonding wire 140. The wire fixing layer 164 may be formed to extend from the adhesion layer 150. For example, the wire fixing layer 164 may be a portion of adhesion layer 150 formed to extend from the adhesion layer 150 disposed between the first and second package substrates 110 and 121 to cover the bonding wire 140. The semiconductor package 104 may further include a first molding layer 172 covering the first package substrate 110 and a second molding layer 174 covering the second package substrate 121.

A process for manufacturing the semiconductor package 104 described above will be described in detail. Here, the description of common features already discussed in the semiconductor package 104 will be omitted for brevity. FIGS. 9A through 9E are views illustrating processes for manufacturing the semiconductor package depicted in FIGS. 7 and 8.

Figure 9A:
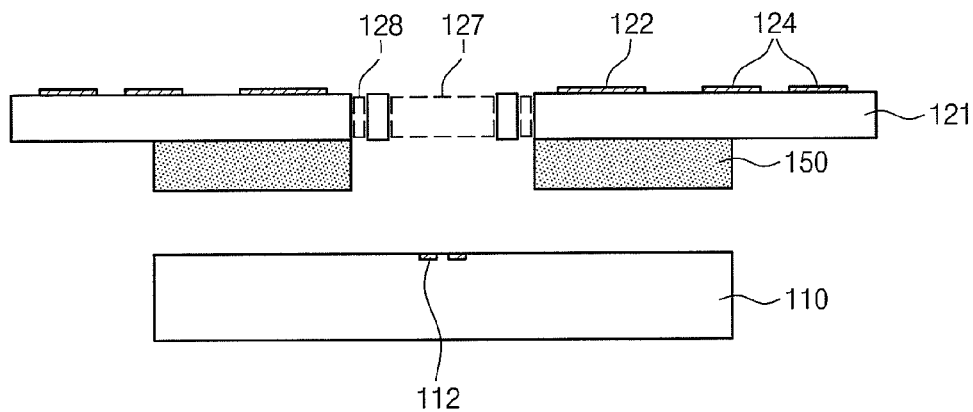
FIGS. 9A through 9E are views illustrating processes for manufacturing the semiconductor package depicted in FIGS. 7 and 8.

Referring to FIG. 9A, a first package substrate 110 and a second package substrate 121 are prepared. The first package substrate 110 may include, for example, a semiconductor integrated circuit chip and the second package substrate 121 may include, for example, a printed circuit board (PCB). A first bonding pad 112 may be formed on the first package substrate 110. A first through hole 127 may be formed at a center of the second package substrate 121 and a second through hole 128 may be formed at the second package substrate 121 adjacent to the first through hole 127. An adhesion layer 150 may be formed on a front side of the second package substrate 121 which is opposite the first through hole 127. Second and third bonding pads 122 and 124 may be formed on a back side of the second package substrate 121. The second bonding pad 122 may be disposed to be adjacent to the second through hole 128 compared with the third bonding pad 124.

Figure 9B:
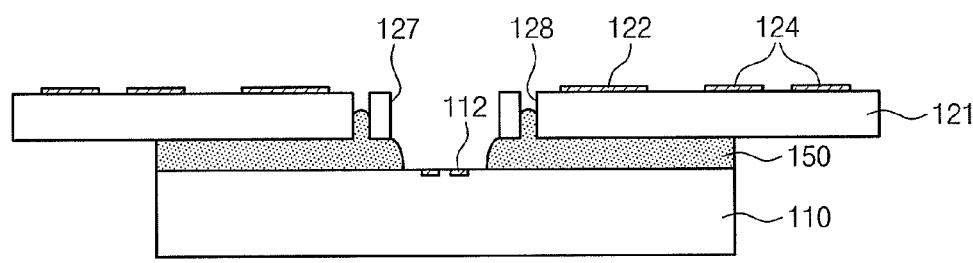
Figure 9C:
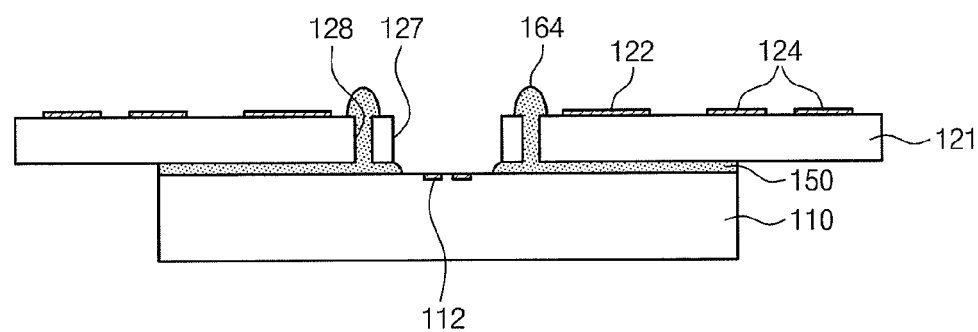

Referring to FIGS. 9B and 9C, the first and second package substrates 110 and 121 are combined with each other. The first and second package substrates 110 and 121 are closely adhered to push out a portion of adhesion layer 150 from a region between the first and second package substrates 110 and 121. A portion of adhesion layer 150 may penetrate the second through hole 128 to extend to a back side of the second package substrate 121. Accordingly, the portion of adhesion layer 150 penetrates the second through hole 128 and extends to a back side of the second package substrate 121 from a front side of the first package substrate 110 to form a wire fixing layer 164.

The quality of material and the thixotropic index of the adhesion layer 150 described above may be controlled based upon, for example, an adhesion function of the first and second package substrates 110 and 121 and an effective generation of the wire fixing layer 164. For example, the adhesion layer 150 may be formed of material including a resin. For example, the adhesion layer 150 may be formed of resin having a thixotropic index of about 1.75 to about 2.75.

Figure 9D:
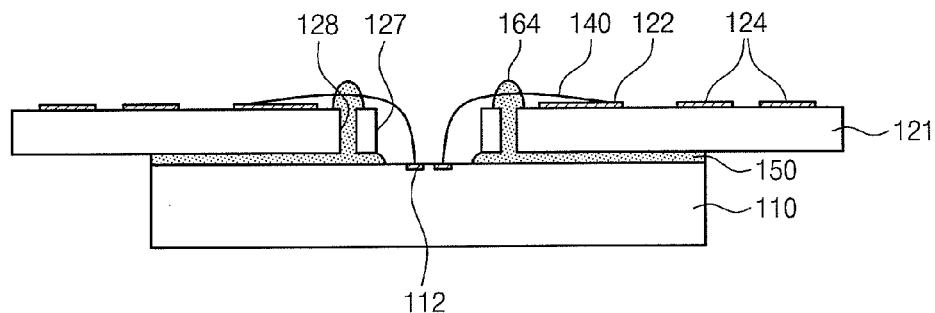

Referring to FIG. 9D, a wire bonding process is performed. The wire bonding process may be substantially equal to or similar to the process for forming the bonding wire 140 described referring to FIG. 3D. For example, a bonding wire 140 connecting a first bonding pad 112 of the first package substrate 110 to a second bonding pad 122 of the second package substrate 121 may be formed. At this time, a portion of bonding wire 140 may be covered with the wire fixing layer 164 formed to extend from the adhesion layer 150.

Figure 9E:
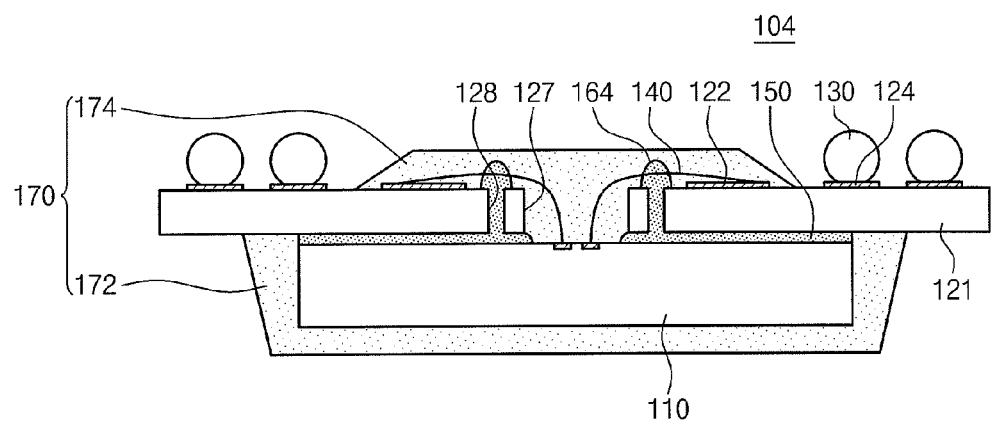

Referring to FIG. 9E, a molding layer 170 covering the first and second package substrates 110 and 121 may be formed. A process for forming the molding layer 170 may be substantially equal to the process for forming the molding layer 170 described referring to FIG. 3E. A bonding terminal 130 may be formed on the second package substrate 121. The bonding terminal 130 may be welded to the third bonding pad 124.

Figure 10:
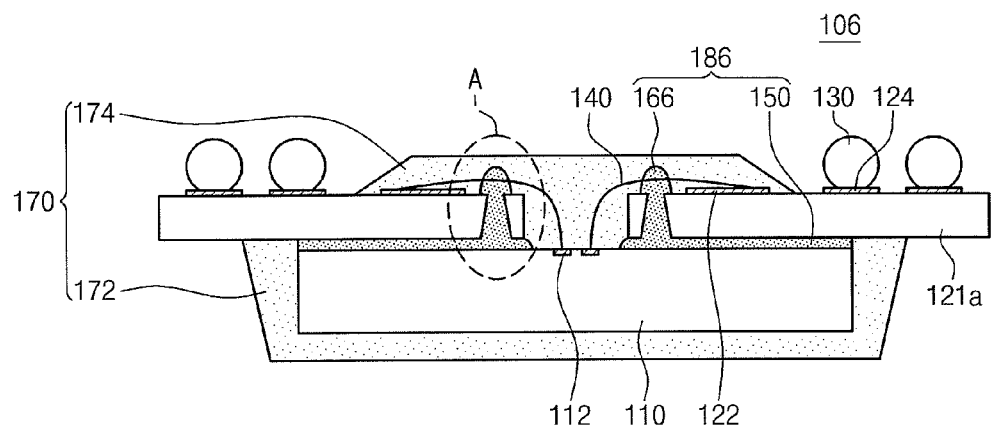
FIG. 10 is a view of a semiconductor package according to a modified exemplary embodiment of the semiconductor package depicted in FIGS. 7 and 8.
Figure 11:
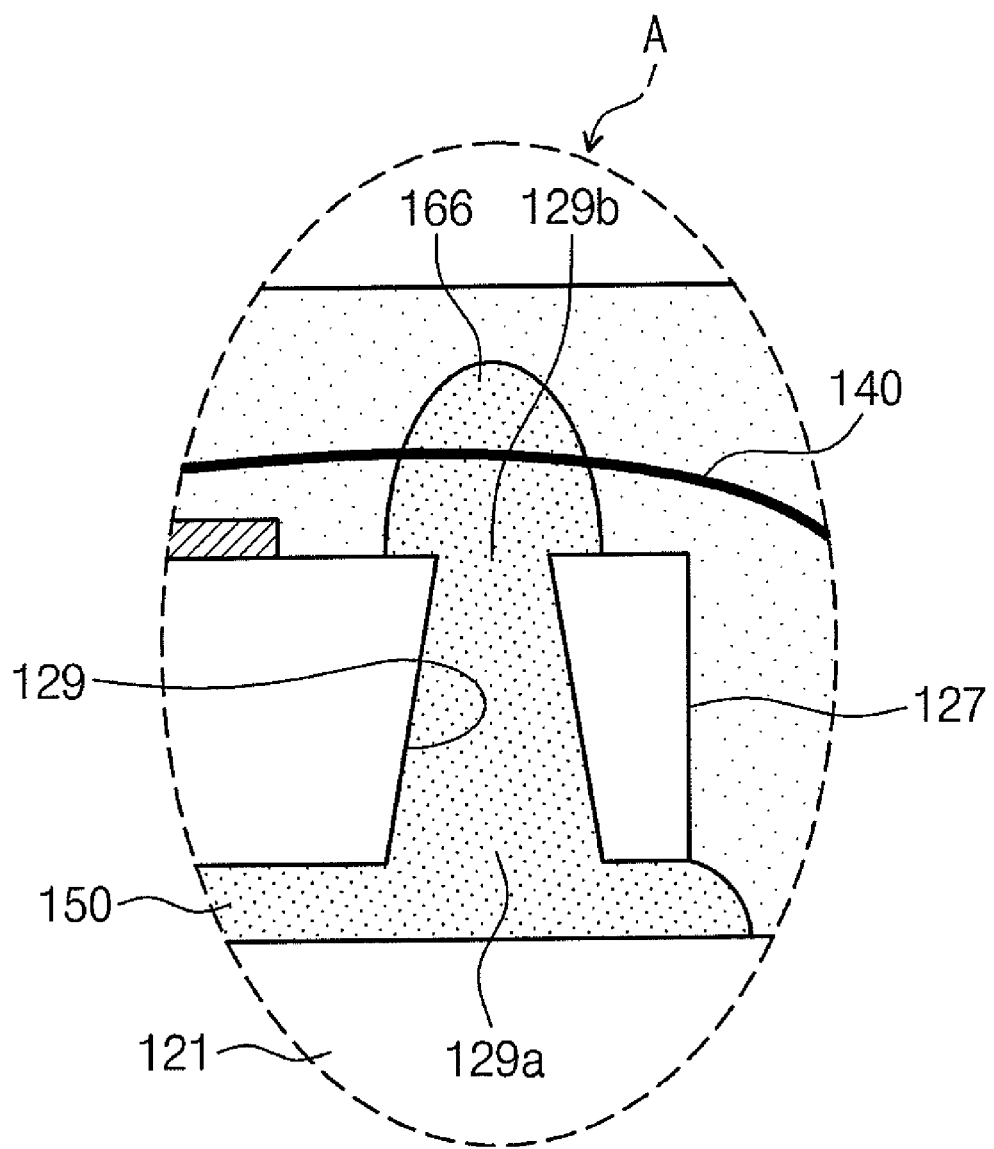
FIG. 11 is an enlarged view of A region depicted in FIG. 10.

FIG. 10 is a view of a semiconductor package according to a modified exemplary embodiment of the semiconductor package depicted in FIGS. 7 and 8. FIG. 11 is an enlarged view of A region depicted in FIG. 10.

Referring to FIGS. 10 and 11, a semiconductor package 106 according to a modified exemplary embodiment of the semiconductor package 104 may include first and second package substrates 110 and 121a combined with each other, a bonding wire 140 connected to first and second bonding pads 112 and 122 respectively, a bonding terminal 130 connected to a third bonding pad 124 and an insulating layer 186 having an adhesion layer 150 combining the first and second package substrates 110 and 121a with each other and a wire fixing layer 166 covering the bonding wire 140. Also, the semiconductor package 106 may further include first and second molding layers 172 and 174 covering the first and second package substrates 110 and 121a.

First and second through holes 127 and 129 may be formed at the second package substrate 121a. The first through hole 127 may be formed on a center of the second package substrate 121a and the second through hole 129 on the second package substrate 121a between the first through hole 127 and the second bonding pad 122. The second through hole 129 may have one side hole 129a formed on a front side of the second package substrate 121a and the other side hole 129b formed on a back side of the second package substrate 121a. The size of one side hole 129a may be greater than the size of the other side hole 129b. In addition, the second through hole 129 may be formed to have a gradually narrowing size as the second through hole 129 approaches the other side hole 129b from one side hole 129a. That is, the second through hole 129 may have a gradually expanding cross section as approaching the first package substrate 110. Thus, the inside of the second through hole 129 may have a shape inclining toward a center of the second through hole 129 as approaching the other side hole 129b from one side hole 129a. The tilt angle of the inside of the second through hole 129 may be variously changed.

In the semiconductor package 106, the adhesion layer 150 can effectively extend in the second through hole 129 from a region between the first and second package substrates 110 and 121a when the first and second package substrates 110 and 121a are combined with each other. Accordingly, the semiconductor package 106 can effectively form the wire fixing layer 166 of a predetermined shape.

Figure 12:
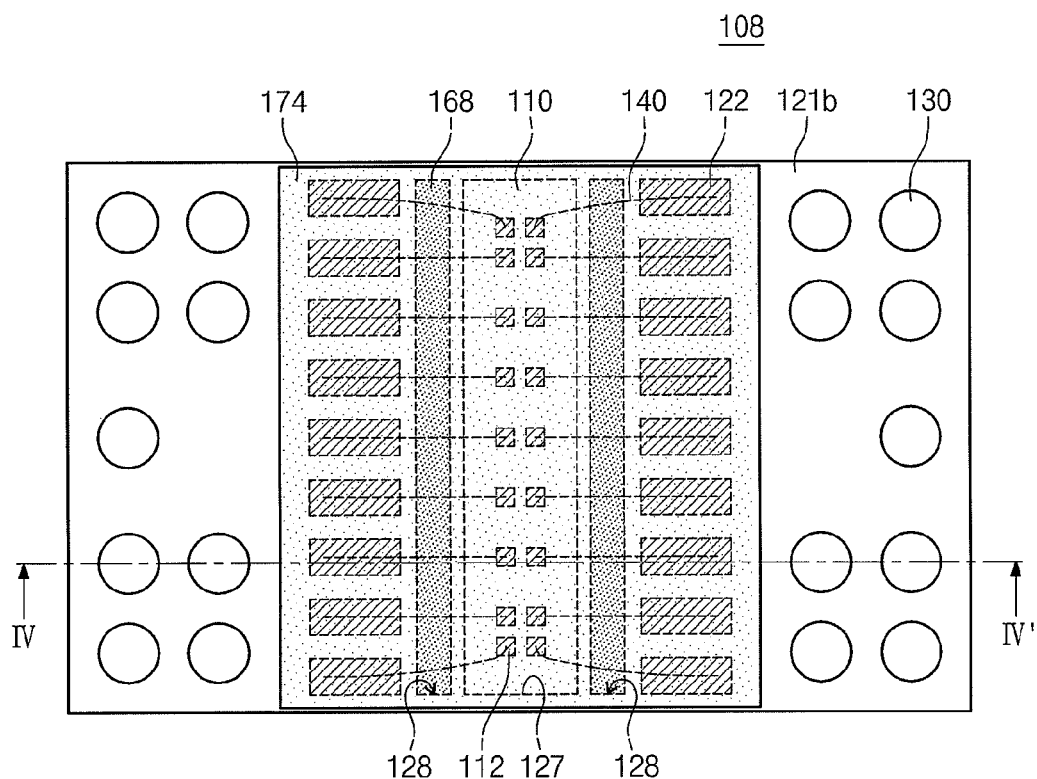
FIG. 12 is a top plan view of a semiconductor package according to a modified exemplary embodiment of the semiconductor package depicted in FIG. 7.
Figure 13:
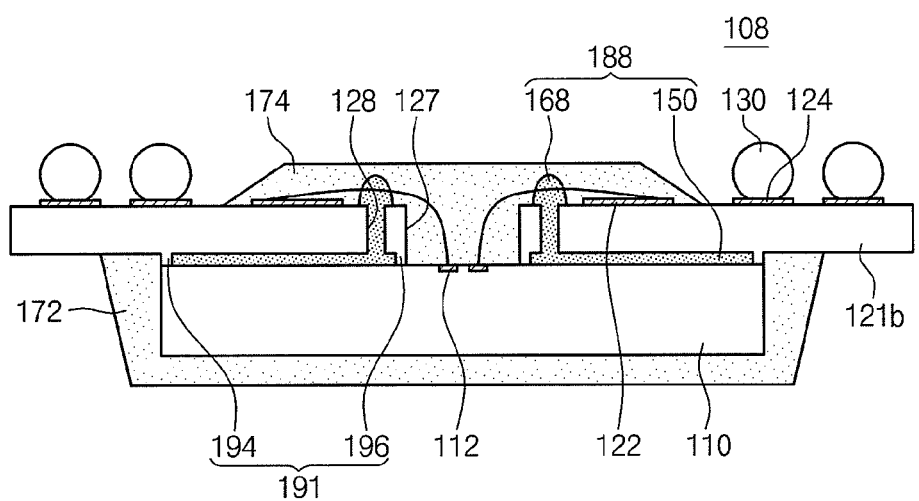
FIG. 13 is a cross sectional view taken along the line IV-IV' depicted in FIG. 12.

FIG. 12 is a top plan view of a semiconductor package according to a modified exemplary embodiment of the semiconductor package depicted in FIG. 7. FIG. 13 is a cross sectional view taken along the line IV-IV' depicted in FIG. 12.

Referring to FIGS. 12 and 13, a semiconductor package 108 may further include a guide member 191 compared with the semiconductor package 104 according to another exemplary embodiment of the present invention referring to FIGS. 7 and 8. The semiconductor package 108 may include first and second package substrates 110 and 121b combined with each other by an adhesion layer 150, a bonding wire 140 bonded to a first bonding pad 112 and a second bonding pad 122, a bonding terminal 130 welded to a third bonding pad 124, an insulating layer 188 having an adhesion layer 150 combining the first and second package substrates 110 and 121b with each other and a wire fixing layer 168 fixing the bonding wire 140, first and second molding layer 172 and 174 covering the first and second package substrates 110 and 121b respectively and a guide member 191.

The guide member 191 may be provided to guide the adhesion layer 150 pushed out from a region between the first and second package substrates 110 and 121b when forming the wire fixing layer 162. The guide member 191 may include a second protrusion 194 and a third protrusion 196. The second protrusion 194 may have a structure substantially equal to or similar to the second protrusion 194 described referring to FIG. 5. The third protrusion 196 may be formed to protrude toward the first package substrate 1-10 from a front side of the second package substrate 121b. The third protrusion 196 may be disposed at a region of the second package substrate 121b adjacent to a first through hole 127. Thus, the third protrusion 196 may form an interface between the first through hole 127 and a second through hole 128.

A process for manufacturing the semiconductor package 108 will be described in detail below. Here, the description of common features already discussed in the semiconductor package 108 will be omitted for brevity. FIGS. 14A through 14E are views illustrating processes for manufacturing the semiconductor package depicted in FIG. 12.

Figure 14A:
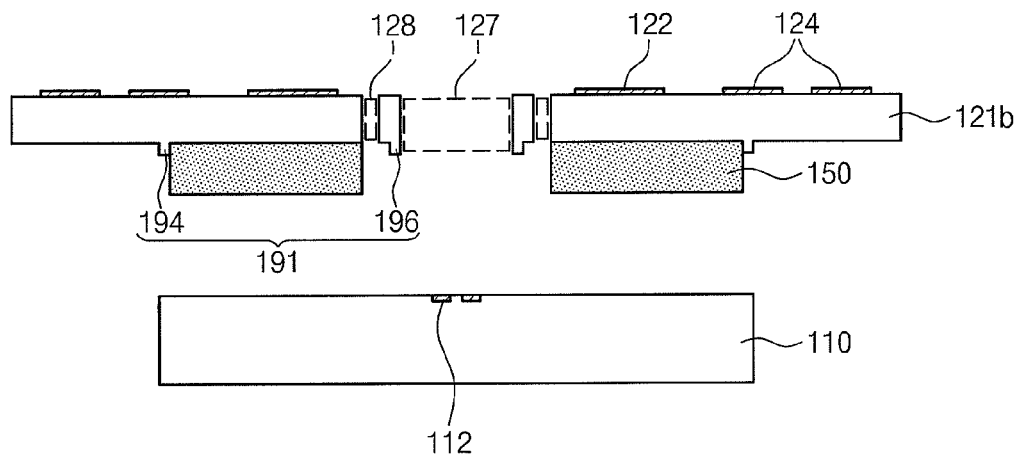
FIGS. 14A through 14E are views illustrating processes for manufacturing the semiconductor package depicted in FIG. 12.

Referring to FIG. 14A, a first package substrate 110 including a first bonding pad 112 and a second package substrate 121b including second and third bonding pads 122 and 124 are provided. The first package substrate 110 may include, for example, a semiconductor integrated circuit chip and the second package substrate 121b may include, for example, a printed circuit board (PCB). A first through hole 127 may be formed at a center of the second package substrate 121b and a second through hole 128 may be formed at the second package substrate 121b adjacent to the first through hole 127. An adhesion layer 150 may be disposed between a second protrusion 194 and the second through hole 128.

A guide member 191 may be formed on the second package substrate 121b. The guide member 191 may include a second protrusion 194 and a third protrusion 196. The second protrusion 194 may be formed to extend toward an edge of the first package substrate 110 from a front side of the second package substrate 121b. The third protrusion 196 may be formed to extend toward the first package substrate 110 from a front side of the second package substrate 121b.

Figure 14B:
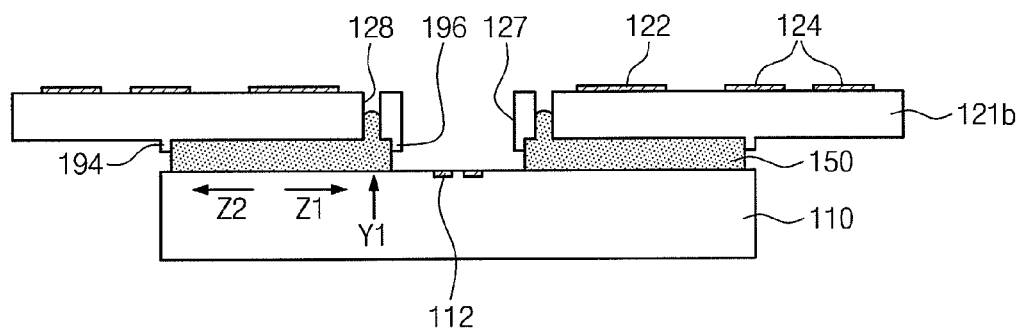
Figure 14C:
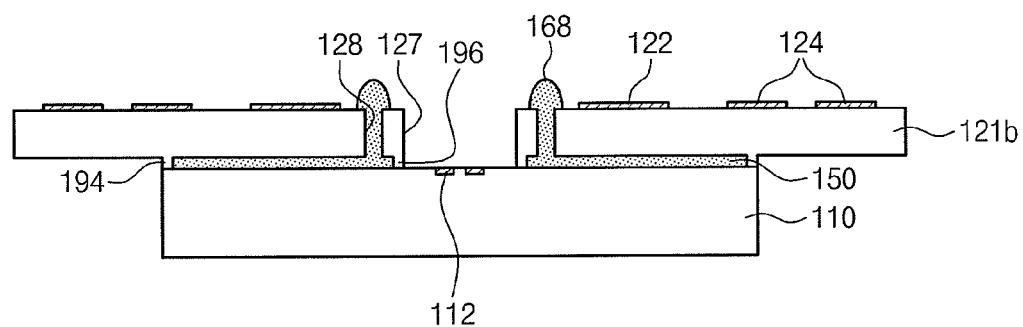

Referring to FIGS. 14B and 14C, the first package substrate 110 and the second package substrate 121b are combined with each other. As the first and second package substrates 110 and 121b are adhered closely to each other, a portion of the adhesion layer 150 may extend in a first direction (Z1) from a region between the first and second package substrates 110 and 121b. At this time, an extending direction of a portion of adhesion layer 150 extending in a first direction (Z1) may be changed to an upward direction (Y1) by the third protrusion 196 to extend toward the second through hole 128. As a result, the portion of adhesion layer 150 penetrates the second through hole 128 and extends to a back side of the second package substrate 121b to form a wire fixing layer 168.

When the first and second package substrates 110 and 121b are combined with each other, the second protrusion 194 may prevent the adhesion layer 150 from being pushed out toward a second direction (Z2) from a region between the first and second package substrates 110 and 121b. The second direction (Z2) may be opposite to the first direction (Z1). Thus, the second protrusion 194 may prevent the adhesion layer 150 from being pushed out toward a space in which a first molding layer (172 of FIG. 14E) is formed.

Figure 14D:
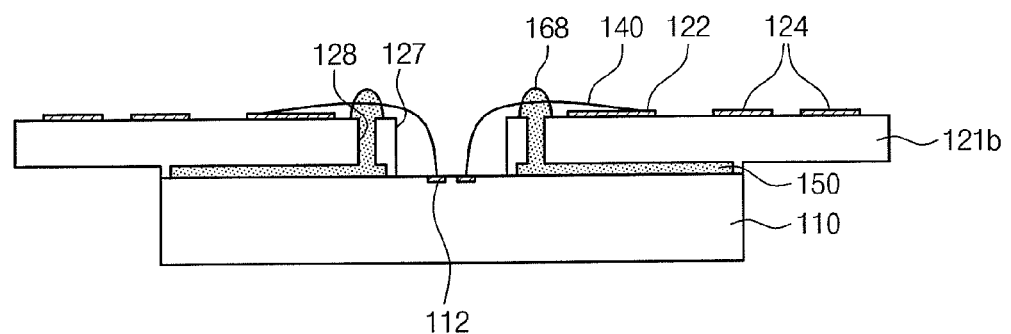

Referring to FIG. 14D, a wire bonding process is performed. The wire bonding process may be substantially equal to or similar to the process for forming the bonding wire 140 described referring to FIG. 3D. For example, a bonding wire connecting a first bonding pad 112 of the first package substrate 110 to a second bonding pad 122 of the second package substrate 121b may be formed. At this time, a portion of bonding wire 140 may be covered with the wire fixing layer 168.

Figure 14E:
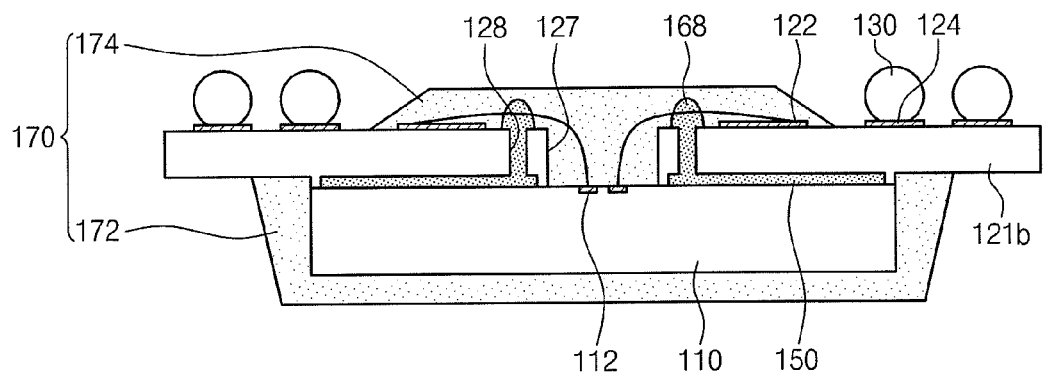

Referring to FIG. 14E, a molding layer 170 covering the first and second package substrates 110 and 121b may be formed. A process for forming the molding layer 170 may be substantially equal to or similar to the process of forming the molding layer 170 described referring to FIG. 3E. As a result, the first package substrate 110 may be covered with the first molding layer 172 and the second package substrate 121b may be covered with a second molding layer 174. A bonding terminal 130 may be formed on the second package substrate 121b. The bonding terminal 130 may be welded to a third bonding pad 124.

The semiconductor package 108 may include a guide member 191 guiding a portion of adhesion layer 150 pushed out from a region between the first and second package substrates 110 and 121b when the first and second package substrates 110 and 121b are combined with each other. Accordingly, the semiconductor package 108 can more effectively form the wire fixing layer 169 satisfying a predetermined shape.

Figure 15:
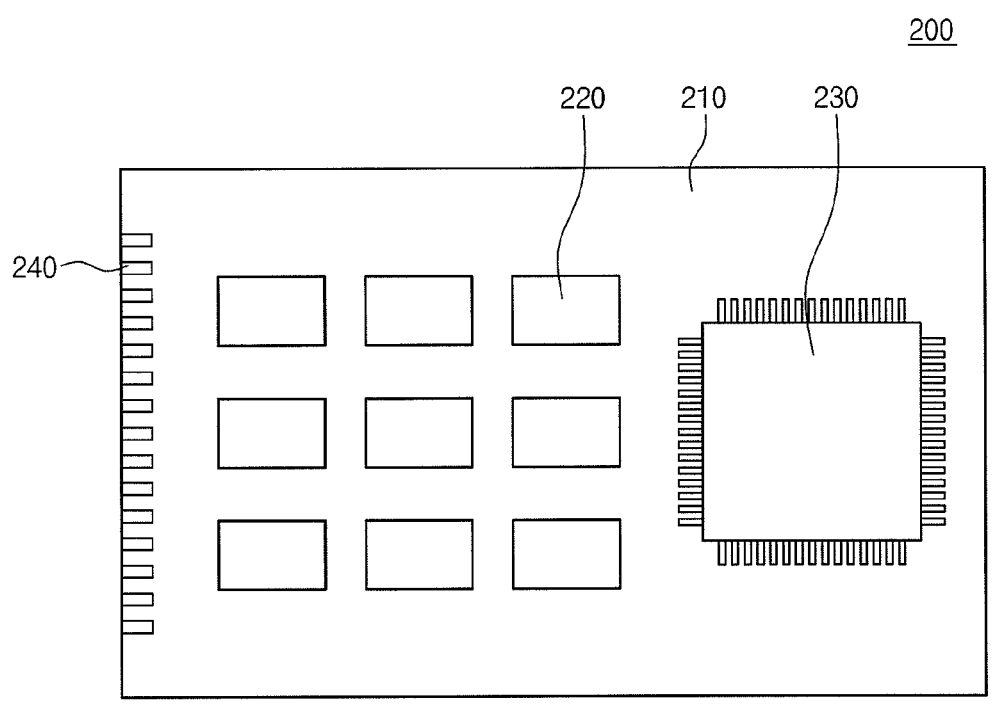
FIG. 15 is a view of a package module including a semiconductor package according to an exemplary embodiment of the present invention.

The semiconductor package technique described above may be applied to a variety of semiconductor devices and a package module including semiconductor devices. FIG. 15 is a view of a package module including a semiconductor package according to exemplary embodiments of the present invention. Referring to FIG. 15, a package module 200 may be provided in a shape of a semiconductor integrated circuit chip 220 and a semiconductor integrated circuit chip 230 packaged with a quad flat package (QFP) type. The package module 200 may be formed on a substrate 210 by setting up semiconductor devices 220 and 230 to which the semiconductor package technique according to exemplary embodiments of the present invention is applied. The package module 200 can be connected to an external device through an external connection terminal 240 provided to one side of the substrate 210.

Figure 16:
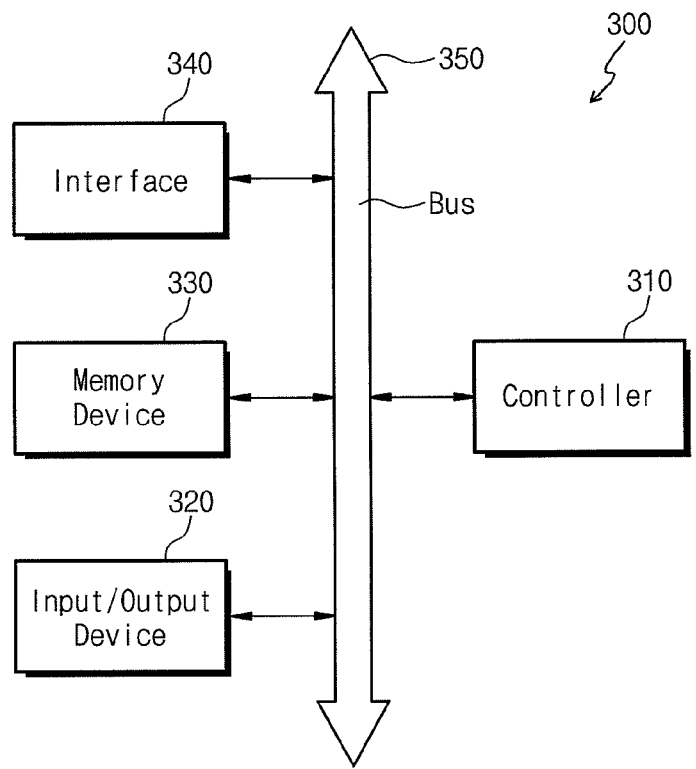
FIG. 16 is a block diagram of an electronic device including a semiconductor package according to an exemplary embodiment of the present invention.

The semiconductor package technique can be applied to an electronic system. FIG. 16 is a block diagram of an electronic device including a semiconductor package to which a technique of exemplary embodiments of the present invention is applied. Referring to FIG. 16, an electronic system 300 may include, for example, a controller 310, an input/output device 320 and a memory device 330. The controller 310, the input/output device 320 and the memory device 330 may be connected to one another through, for example, a bus 350. The bus 350 may be a path through which data is transferred. The controller 310 may include, for example, at least one of a micro processor, a digital signal processor, a microcontroller and a logic device having a function similar to the micro processor, the digital signal processor, the microcontroller. The controller 310 and the memory device 330 may include a semiconductor package according to exemplary embodiments of the present invention. The input/output device 320 may include, for example, at least one selected from a keypad, a keyboard and a display device. The memory device 330 is a device storing data. The memory device 330 may store data and/or an instruction executed by the controller 310. The memory device 330 may include a volatile memory device and/or a nonvolatile memory device. The memory device 330 may be formed of, for example, a flash memory. For example, a flash memory to which a technique of the present invention is applied may be set to a data processing system such as a mobile device or a desk top computer. The flash memory may be formed of, for example, a semiconductor disc device (SSD). In this case, the electronic system 300 can stably store huge amounts of data on the flash memory system. The electronic system 300 may further include, for example, an interface 340 for transmitting data to a communication network or receiving data from a communication network. The interface 340 may be, for example, a wireline/wireless shape. The interface 340 may include an antenna or a wireline/wireless transceiver. The electronic system may further include, for example, an application chip set, a camera image processor (CIS) and an input/output device.

The electronic system 300 may be embodied by, for example, a mobile system, a personnel computer, an industrial computer or a logic system performing a variety of functions. For example, the mobile system may be one of a personal digital assistant (PDA), a portable computer, a web tablet, a mobile phone, a wireless phone, a laptop computer, a memory card, a digital music system and a data transmission/receipt system. When the electronic system 300 is a device which can perform a wireless communication, the electronic system 300 may be used in a communication interface protocol of a third generation such as, for example, CDMA, GSM, NADC, E-TDMA, CDMA2000.

Figure 17:
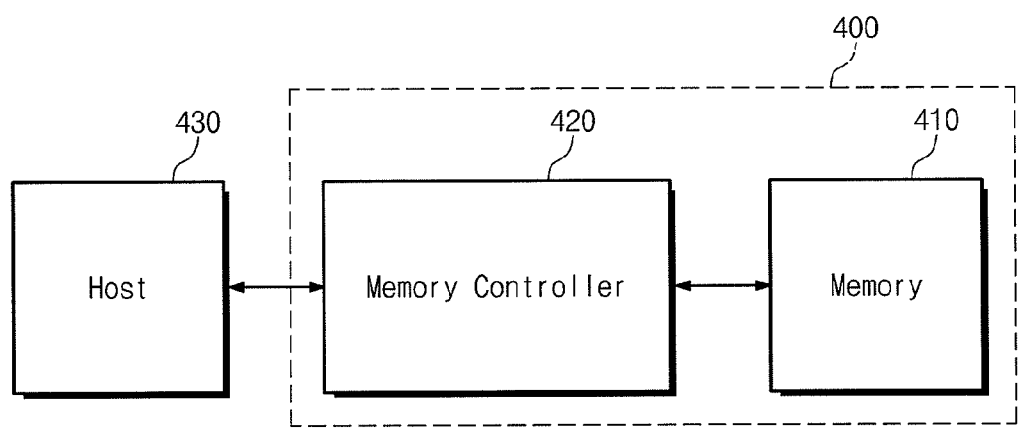
FIG. 17 is a block diagram of a memory system including a semiconductor package according to an exemplary embodiment of the present invention.

The semiconductor device to which a technique of exemplary embodiments of the present invention is applied may be provided in a shape of a memory card. FIG. 17 is a block diagram of a memory system including a semiconductor package according to the present invention. Referring to FIG. 17, a memory card 400 may include, for example, a nonvolatile memory device 410 and a memory controller 420. The nonvolatile memory device 410 and the memory controller 420 can store date or decode stored data. The nonvolatile memory device 410 may include at least one of nonvolatile memory devices to which a technique of a semiconductor package according to exemplary embodiments of the present invention is applied. The memory controller 420 can readout stored data in response to a request of decoding/writing of a host or control the flash memory device 410 to store data.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor package comprising:
a first package substrate and a second package substrate;
a bonding wire electrically connecting the first package substrate and the second package substrate to each other, wherein the second package substrate comprises a through hole penetrating a portion of the second package substrate so as to expose a portion of the first package substrate, thereby providing a space where the bonding wire is disposed; and an insulating layer which adheres the first package substrate and the second package substrate to each other and covers a portion of the bonding wire, wherein the insulating layer comprises: an adhesion layer which is disposed between the first package substrate and the second package substrate to adhere the first package substrate and the second package substrate to each other; and a wire fixing layer which includes a portion of material which is part of the adhesion layer and which extends from the adhesion layer and into the through hole to occupy the through hole and cover the portion of the bonding wire.

2. A semiconductor package comprising:

a first package substrate and a second package substrate;

a bonding wire electrically connecting the first package substrate and the second package substrate to each other, wherein the second package substrate comprises a through hole penetrating a center of the second package substrate so as to expose a portion of the first package substrate, thereby providing a space where the bonding wire is disposed;

an insulating layer which adheres the first package substrate and the second package substrate to each other and covers a portion of the bonding wire, wherein the insulating layer comprises: an adhesion layer which is disposed between the first package substrate and the second package substrate to adhere the first package substrate and the second package substrate to each other, and a wire fixing layer which includes a portion of material which extends from the adhesion layer and into the through hole to occupy the through hole; and a guide member limiting an extension of the adhesion layer to a portion of region of the through hole.

3. The semiconductor package of claim 2, wherein the guide member comprises a first protrusion protruded toward the through hole from the second package substrate, the guide member being disposed within the through hole.

4. The semiconductor package of claim 3, wherein the guide member further comprises a second protrusion protruded toward an edge of the first package substrate from the second package substrate.

5. The semiconductor package of claim 1, wherein the second package substrate comprises:

a first through hole penetrating a center of the second package substrate to expose a portion of the first package substrate, thereby providing a space where the bonding wire is disposed; and a second through hole penetrating the second package substrate adjacent to the first through hole so as to expose an another portion of the first package substrate.

6. The semiconductor package of claim 5, wherein the insulating layer comprises:

an adhesion layer which is disposed between the first package substrate and the second package substrate to adhere the first package substrate and the second package substrate to each other; and a wire fixing layer which includes a portion of material that extends from the adhesion layer and into the second through hole to occupy the second through hole.

7. The semiconductor package of claim 5, wherein the second through hole has a gradually expending cross section as approaching the first package substrate.

8. The semiconductor package of claim 5, further comprising a guide member limiting an extension of the adhesion layer to a portion of a region of the through hole.

9. The semiconductor package of claim 8, wherein the guide member comprises a second protrusion protruded toward an edge of the first package substrate from the second package substrate.

10. The semiconductor package of claim 9, wherein the guide member further comprises a third protrusion which is protruded toward the first package substrate from the second package substrate to form an interface between the first through hole and the second through hole.

11. The semiconductor package of claim 1, wherein the insulating layer comprises silicon adhesive having a thixotropic index of about 1.75 to about 2.75.

12. A semiconductor package comprising:

a first package substrate and a second package substrate, wherein the second package substrate includes a through hole therein;

a bonding wire electrically connecting the first package substrate and the second package substrate to each other; and an insulating layer which adheres the first package substrate and the second package substrate to each other and covers a portion of the bonding wire, wherein the insulating layer comprises:

an adhesion layer which is disposed between the first package substrate and the second package substrate to adhere the first package substrate and the second package substrate to each other;

a wire fixing layer which includes a portion of material which extends from the adhesion layer and into the through hole to occupy the through hole and wherein the adhesion layer and the wire fixing layer are formed of a same material as one another and wherein there is no interface between the adhesion layer and the wire fixing layer; and a guide member limiting an extension of the adhesion layer to a portion of region of the through hole.

13. The semiconductor package of claim 12, wherein the guide member comprises a first protrusion protruded toward the through hole from the second package substrate, the guide member being disposed within the through hole.

14. The semiconductor package of claim 13, wherein the guide member further comprises a second protrusion protruded toward an edge of the first package substrate from the second package substrate.

* * * * *